(12) United States Patent
Park

(10) Patent No.: US 7,315,195 B2
(45) Date of Patent: Jan. 1, 2008

(54) HIGH VOLTAGE GENERATION CIRCUIT

(75) Inventor: Mun Park, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/907,876

(22) Filed: Apr. 19, 2005

(65) Prior Publication Data
US 2005/0231267 A1 Oct. 20, 2005

(30) Foreign Application Priority Data
Apr. 19, 2004 (KR) .............. 10-2004-0026768

(51) Int. Cl.
G05F 3/02 (2006.01)
(52) U.S. Cl. .................. 327/536; 363/59
(58) Field of Classification Search ......... 327/536
See application file for complete search history.

(56) References Cited

U.S. PATENT DOCUMENTS

| 5,349,562 | A | | 9/1994 | Tanizaki | 365/222 |
| 5,566,117 | A | | 10/1996 | Okamura et al. | 365/222 |
| 5,889,664 | A | * | 3/1999 | Oh | 363/60 |
| 5,952,872 | A | * | 9/1999 | Hur | 327/535 |
| 5,999,009 | A | * | 12/1999 | Mitsui | 324/765 |
| 6,281,742 | B1 | * | 8/2001 | Sung | 327/535 |
| 6,518,831 | B1 | * | 2/2003 | Hur et al. | 327/537 |
| 2004/0027900 | A1 | | 2/2004 | Lee | 365/222 |
| 2006/0013030 | A1 | * | 1/2006 | Arimoto et al. | 365/63 |
| 2006/0226891 | A1 | * | 10/2006 | Park et al. | 327/536 |

FOREIGN PATENT DOCUMENTS

| JP | 4372790 | 12/1992 |
| JP | 5342862 | 12/1993 |
| JP | 2004079162 | 3/2004 |
| KR | 1020020053482 | 7/2002 |

* cited by examiner

Primary Examiner—Kenneth B. Wells
Assistant Examiner—Ryan C. Jager
(74) Attorney, Agent, or Firm—Marshall, Gerstein & Borun LLP

(57) ABSTRACT

A high voltage-generating circuit comprises a control circuit for generating a control signal for executing an operation command and generating a refresh signal depending upon a refresh operation, an oscillator driven according to an enable signal, for outputting an oscillation signal the cycle of which is controlled according to a refresh signal, a charge pump circuit for generating a high voltage using a power source voltage according to the oscillation signal, wherein the charge pump circuit has the ascent rate of the high voltage controlled according to variation in the cycle of the oscillation signal, and a level detection circuit for comparing the high voltage and a reference voltage to determine whether the high voltage reaches a target value, and controlling the operation of the oscillator according to the result of the comparison.

15 Claims, 4 Drawing Sheets

HIGH VOLTAGE GENERATION CIRCUIT

FIELD OF THE INVENTION

The present invention relates to a high voltage-generating circuit, and more specifically, to a voltage-generating circuit in which the oscillation cycle is changed depending upon the operation of a DRAM and a voltage level within a chip is thus stabilized, thereby improving the operational characteristics of the DRAM.

DISCUSSION OF RELATED ART

Generally, a DRAM is a random access memory in which data can be written into a memory cell having one transistor and one capacitor or the data written into the memory cell can be read. If a row address strobe signal becomes active, a row address that has been inputted at this time is decoded to drive a selected word line. However, since a NMOS transistor is used as one cell transistor constituting a memory cell, a DRAM needs a high voltage-generating circuit for generating a high voltage Vpp of a power source voltage Vcc+a threshold voltage Vtn+ΔV considering voltage loss due to a threshold voltage Vtn.

This high voltage-generating circuit basically includes an oscillator, a charge pump circuit and a level detection circuit. The oscillator is generates an oscillation signal having a predetermined cycle in response to an enable signal. The charge pump circuit is driven according to the oscillation signal to generate a high voltage Vpp through a pumping operation using a power source voltage Vcc being an external voltage. Further, the level detection circuit compares a reference voltage and the high voltage Vpp to determine whether the high voltage Vpp reaches a target value, and controls the operation of the oscillator according to the result of the comparison, thereby making the high voltage Vpp keep a predetermined electric potential.

Generally, the high voltage Vpp is generated with the same oscillation cycle through a normal operation or a refresh operation of a DRAM, and the high voltage Vpp is generated using the power source voltage Vcc through the same mechanism. However, since large amounts of the high voltage Vpp are used at once in the refresh operation (all banks active), the electric potential of the high voltage Vpp can be lowered. This may cause the operational characteristics of the DRAM to lower.

SUMMARY OF THE INVENTION

Accordingly, the present invention has been made in view of the above problems, and it is an object of the present invention to provide a voltage-generating circuit in which the oscillation cycle is changed depending upon the operation of a DRAM and a voltage level within a chip is thus stabilized, thereby improving the operational characteristics of the DRAM.

Another object of the present invention is to provide a high voltage-generating circuit that can prevent from lowering a high voltage level in a refresh operation by increasing pumping amount of an oscillator and rapidly rising the high voltage according to a refresh information which is applied to the oscillator in the refresh mode.

To achieve the above objects, according to the present invention, there is provided a high voltage-generating circuit, comprising a control circuit for generating a control signal for executing an operation command and generating a refresh signal depending upon a refresh operation, an oscillator driven according to an enable signal, for outputting an oscillation signal the cycle of which is controlled according to a refresh signal, a charge pump circuit for generating a high voltage using a power source voltage according to the oscillation signal, wherein the charge pump circuit has the ascent rate of the high voltage controlled according to variation in the cycle of the oscillation signal, and a level detection circuit for comparing the high voltage and a reference voltage to determine whether the high voltage reaches a target value, and controlling the operation of the oscillator according to the result of the comparison.

The oscillator reduces the cycle of the oscillation signal according to the level of the refresh signal depending upon the refresh operation, and increases the cycle of the oscillation signal according to the level of the refresh signal depending upon a normal operation.

The oscillator comprises a logic unit for outputting the oscillation signal according the enable signal, a delay unit for delaying the oscillation signal received from the logic unit, and a plurality of switching units for controlling the cycle by setting a delay path of the oscillation signal received from the delay unit according to the refresh signal.

The logic unit comprises a NAND gate for inverting the signal received through a first or second transfer gate according to the enable signal.

The delay unit comprises first delay means for delaying the oscillation signal outputted through the logic unit, and second delay means for delaying the output signal of the first delay means.

The switching unit comprises a first transfer gate for transferring the signal delayed through the first delay means according to the refresh signal, and a second transfer gate for transferring the signal, which is delayed through the first and second delay means, through the operation in a complementary manner together with the first transfer gate according to the refresh signal.

DETAILED DESCRIPTION OF PREFERRED EMBODIMENTS

Now, the preferred embodiments according to the present invention will be described with reference to the accompanying drawings.

Figure 1:
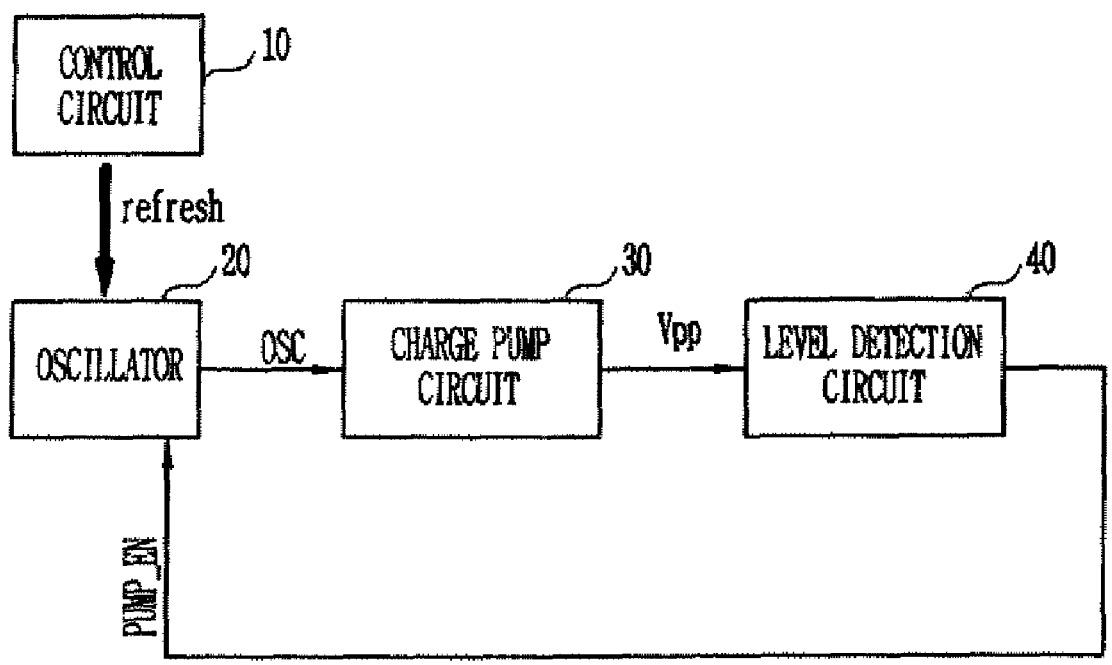
FIG. 1 is a block diagram illustrating the construction of a high voltage-generating circuit according to the present invention.

FIG. 1 is a block diagram illustrating the construction of a high voltage-generating circuit according to the present invention.

If a command depending upon a normal operation or a refresh operation is applied from an external chipset, a control circuit 10 generates an active signal or a precharge signal for executing the command so that a bank and a cell can perform a corresponding operation. Further, the control circuit 10 according to the present invention generates a refresh signal refresh depending upon the refresh operation and applies it to an oscillator 20. At this time, the refresh signal refresh can be applied as a HIGH level if the refresh operation is performed, and can be applied as a LOW level if the normal operation is performed.

The oscillator 20 operates according to an enable signal PUMP EN and the refresh signal refresh to generate an oscillation signal OSC. If the refresh signal refresh is applied as a HIGH level according to the refresh operation, the oscillator 20 reduces the oscillation cycle of the oscillation signal OSC. If the refresh signal refresh is applied as a LOW level according to the normal operation, the oscillator 20 increases the oscillation cycle of the oscillation signal OSC.

A charge pump circuit 30 generates a high voltage Vpp according to the oscillation signal OSC from the oscillator 20 by using a power source voltage Vcc being an external voltage. If the cycle of the oscillation signal OSC, which has been reduced according to the refresh operation, is applied, however, the rise toward a high voltage Vpp level becomes fast. If the cycle of the oscillation signal OSC, which has been increased according to the normal operation, is applied, the rise toward the high voltage Vpp level becomes relatively slow.

A level detection circuit 40 compares a reference voltage and the high voltage Vpp from the charge pump circuit 30 to determine whether the high voltage Vpp reaches a target value. According to the result of the comparison, the level detection circuit 40 inputs a control signal PUMP_EN to the oscillator 20 to control the operation of the oscillator 20.

In the high voltage-generating circuit constructed above according to the present invention, the oscillation cycle of the oscillator 20 is controlled according to the level of the refresh signal refresh from the control circuit 10 depending upon the operation command from the external chipset, and the pumping speed of the high voltage Vpp of the charge pump circuit 30 is controlled accordingly. That is, if the normal operation command is received from the external chipset, the control circuit 10 outputs the refresh signal refresh of a LOW level. The oscillator 20 that has received the refresh signal refresh of the LOW level increases and outputs the cycle of the oscillation signal OSC. The ascent rate toward the high voltage Vpp level of the charge pump circuit 30 becomes slow by means of the oscillation signal OSC having the increased cycle. If the refresh operation command is received from the external chipset, however, the control circuit 10 outputs the refresh signal refresh of a HIGH level. The oscillator 20 that has received the refresh signal refresh of the HIGH level reduces and outputs the cycle of the oscillation signal OSC. The ascent rate toward the high voltage Vpp level of the charge pump circuit 30 becomes fast by means of the oscillation signal OSC having the reduced cycle.

Meanwhile, the level detection circuit 40 compares the reference voltage and the high voltage Vpp received from the charge pump circuit 30. If the high voltage Vpp increases higher than the reference voltage, the level detection circuit 40 stops the operation of the oscillator 20 using the control signal PUMP_EN, so that the pumping operation of the charge pump circuit 30 is stopped. If the high voltage Vpp drops lower than the reference voltage, the level detection circuit 40 operates the oscillator 20 again using the control signal PUMP_EN, so that the high voltage Vpp keeps a predetermined electric potential by means of an operation that performs the pumping operation of the charge pump circuit 30.

Figure 2:
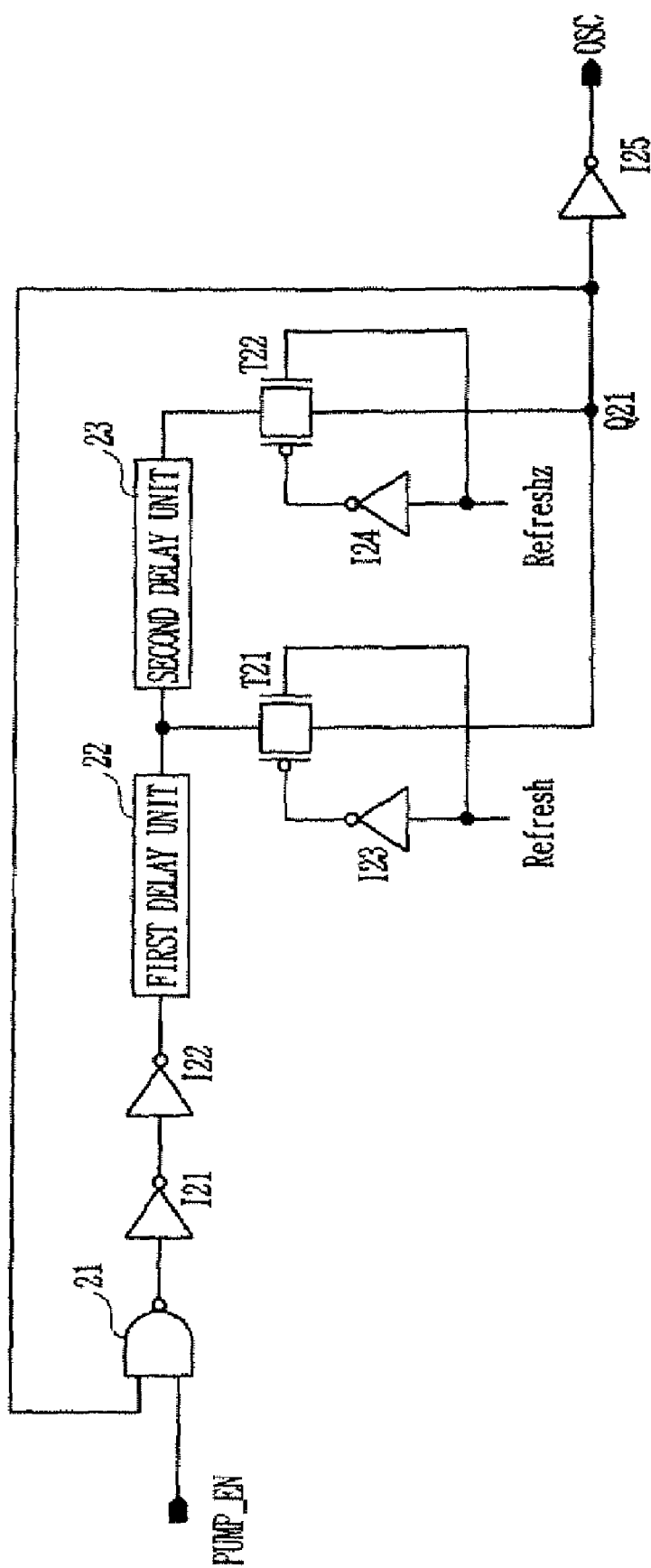
FIG. 2 is a circuit diagram illustrating the construction of an oscillator constituting the high voltage-generating circuit according to the present invention.

FIG. 2 is a detailed circuit diagram of the oscillator shown in FIG. 1, wherein the oscillation cycle is controlled according to the refresh signal according to the present invention.

A NAND gate 21 inverts an electric potential of a first node Q21 according to an enable signal PUMP EN. First and second inverters I21 and I22 stabilize the output signal of the NAND gate 21. A first delay unit 22 delays the output signal of the second inverter 122. A second delay unit 23 delays the signal delayed through the first delay unit 22 once more. However, a delay path through the first and second delay units 22 and 23 is decided by first and second transfer gates T21 and T22. The signal delayed by the first delay unit 22 is transmitted to the first node Q21 through the first transfer gate T21, which is driven according to a refresh signal Refresh and a signal that is inverted from the refresh signal Refresh through a third inverter 123. Further, the signal delayed through the first and second delay units 22 and 23 is transmitted to the first node Q21 through a second transfer gate T22. At this time, the second transfer gate T22 is driven according to a signal, which is inverted from a refresh bar signal refreshz being an inverted signal of the refresh signal Refresh through a fourth inverter I24. The electric potential of the first node Q21 is inverted through a fifth inverter I25 and then outputted as an oscillation signal OSC.

A method of driving the oscillator constructed above, which constitutes the high voltage-generating circuit, according to the present invention will now be described.

If the enable signal PUMP EN is applied as a HIGH level, the NAND gate 21 inverts an electric potential of the first node Q21. The first and second inverters 121 and 122 stabilize the output signal of the NAND gate 21. The first and second delay units 22 and 23 delay the output signal of the second inverter 122. If the refresh signal Refresh is applied as a LOW level in the normal operation, however, the refresh bar signal Refreshz is applied as a HIGH level. Thus, the first transfer gate T21 is turned off and the second transfer gate T22 is turned on. Accordingly, the signal delayed through the first and second delay units 22 and 23 is transferred to the first node Q21 through the second transfer gate T22. The electric potential of the first node Q21 is inverted through the fifth inverter 125 and then outputted as the oscillation signal OSC. On the contrary, if the refresh signal Refresh is applied as a HIGH level in the refresh operation, the refresh bar signal Refreshz is applied as a LOW level. Thus, the first transfer gate T21 is turned on and the second transfer gate T22 is turned off. Accordingly, the signal delayed through the first delay unit 22 is transferred to the first node Q21 through the first transfer gate T21. An electric potential of the first node Q21 is inverted through the fifth inverter 125 and then outputted as the oscillation signal OSC.

As described above, if the refresh signal Refresh is applied as the LOW level in the normal operation, a delay path is set through the first and second delay units 22 and 23. The cycle of the oscillation signal OSC is thus increased and then outputted. If the refresh signal Refresh is applied as the HIGH level in the refresh operation, a delay path is set through the first delay unit 22. The cycle of the oscillation signal OSC is thus more reduced than in the normal operation and then outputted.

Figure 3:
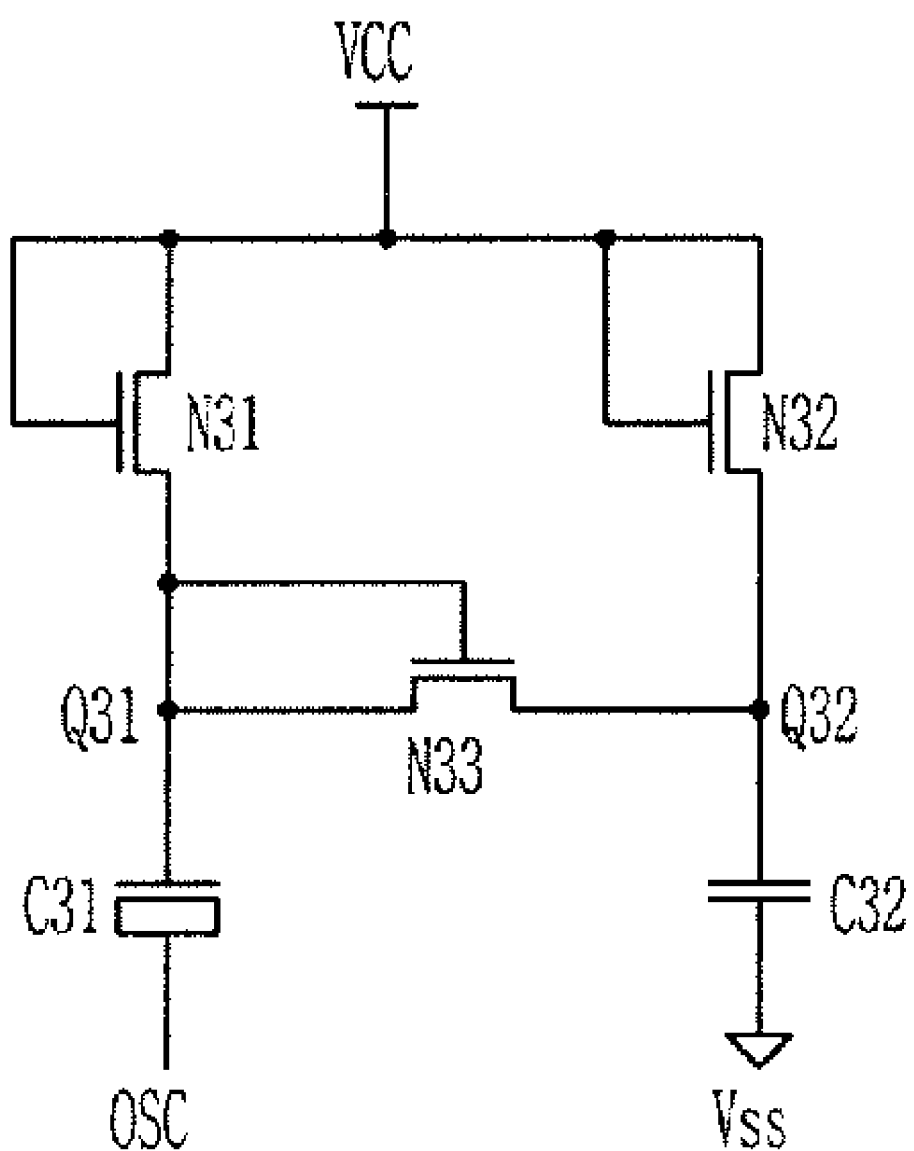
FIG. 3 is a circuit diagram illustrating the construction of a charge pump circuit constituting the high voltage-generating circuit according to the present invention.

FIG. 3 is a detailed circuit diagram illustrating the construction of the charge pump circuit 30 shown in FIG. 1 according to the present invention.

A first NMOS transistor N31 having a gate terminal connected to a power supply terminal Vcc is connected between a power supply terminal Vcc and a first node Q31. A second NMOS transistor N32 having a gate terminal connected to a power supply terminal Vcc is connected between the power supply terminal Vcc and a second node Q32. A third NMOS transistor N33, which is driven according to an electric potential of the first node Q31, is connected between the first node Q31 and the second node Q32. A first capacitor C31 is connected between the first node Q31 and an input terminal of an oscillation signal OSC. A second capacitor C32 is connected between the second node Q32 and a ground terminal Vss. At this time, an electric potential of the second node Q32 is used as an electric potential of a high voltage Vpp.

The charge pump circuit constructed above, which constitutes the high voltage-generating circuit according to the present invention, has its ascent rate toward the high voltage Vpp level changed according to the cycle of the oscillation signal OSC. A method of driving the charge pump circuit will now be described with reference to waveforms shown in FIGS. 4a and 4b.

Figure 4A:
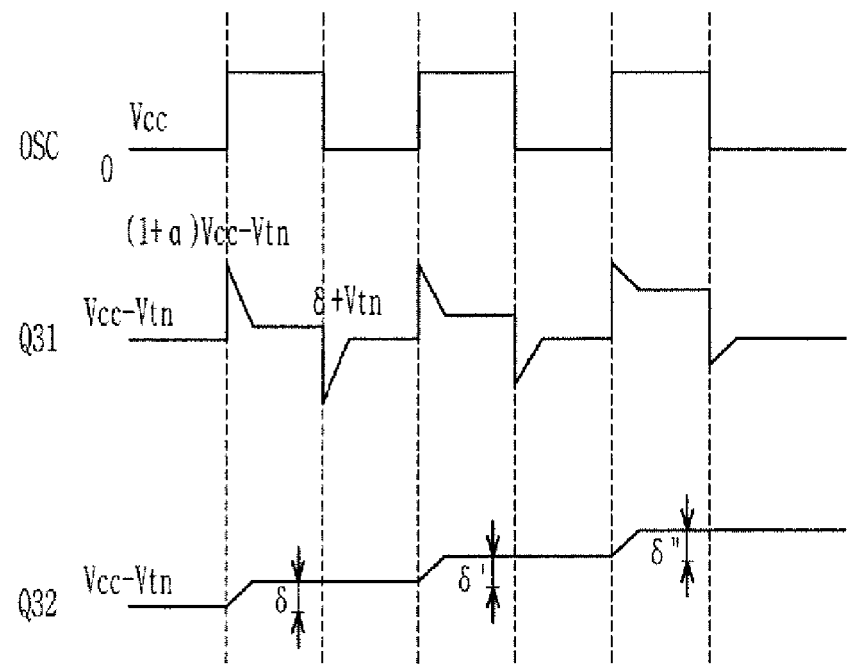
FIG. 4 shows an output waveform of the charge pump circuit according to the present invention.

FIG. 4a is a waveform showing the output of the charge pump circuit depending upon the oscillation signal OSC having an increased cycle according to the normal operation. Before the oscillation signal OSC is applied, the first node Q31 maintains an electric potential of Vcc−Vtn in which a threshold voltage Vtn of the first NMOS transistor N31 is subtracted from the power source voltage Vcc. Further, the second node Q32 maintains an electric potential of Vcc−Vtn in which a threshold voltage Vtn of the second NMOS transistor N32 is subtracted from the power source voltage Vcc. In this state, if the oscillation signal OSC is applied as a HIGH level that maintains the electric potential of $\alpha$Vcc and the first capacitor C31 is thus charged, the first node Q31 rises from the electric potential of Vcc−Vtn to an electric potential of $(1+\alpha)$ Vcc−Vtn. After a predetermined time elapses, the electric potential of the first node Q31 maintains an electric potential of $\delta$+Vtn, which is higher than the power source voltage Vcc. At this time, the electric potential of the second node Q32 maintains an electric potential of $\delta$ in which the threshold voltage Vtn of the third NMOS transistor N33 is subtracted from the electric potential of the first node Q32. Thereafter, if the oscillation signal OSC is applied as a LOW level, the electric potential of the first node Q31 maintains an electric potential lower than Vcc−Vtn immediately after the oscillation signal OSC is applied, and then maintains the electric potential of Vcc−Vtn, which is slowly increased. However, since the electric potential is lower than the electric potential of $\delta$ of the second node Q32, the second node Q32 keeps.

If the oscillation signal OSC is applied as a HIGH level, the first node Q31 maintains an electric potential of $\delta'$+Vtn, which is higher than $\delta$. Thus, the second node Q32 maintains an electric potential of $\delta'$. Thereafter, if the oscillation signal OSC is applied as a LOW level, the first node Q31 maintains the electric potential of VCC−Vtn, and the second node Q32 maintains the electric potential of $\delta'$.

As such, as the oscillation signal OSC is repeatedly applied, the electric potential of the second node Q32 continues to rise and makes the electric potential of the second node Q32 as a high voltage Vpp.

Figure 4B:
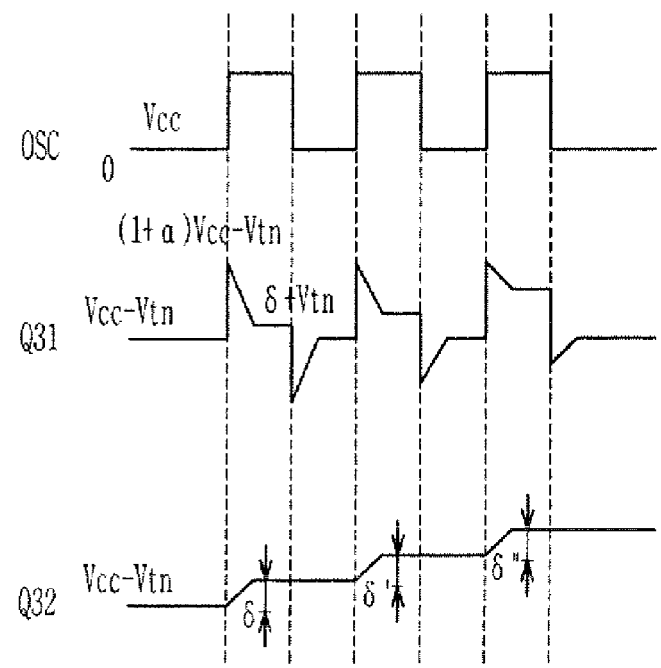

FIG. 4b is a waveform showing the output of the charge pump circuit depending upon the oscillation signal OSC in the precharge operation, which is outputted as a cycle that is more reduced than in the normal operation. From FIG. 4b, it can be seen that the high voltage Vpp is generated in the same method as that described with reference to FIG. 4a, but the high voltage Vpp is rapidly increased compared to the normal operation.

As described above, according to the present invention, the pumping speed of a charge pump circuit is made fast by reducing the oscillation cycle of an oscillator in a refresh operation than the oscillation cycle in a normal operation. Therefore, the present invention is advantageous in that it can improve a stable operation and characteristics of a DRAM since a high voltage is prevented from lowering depending on all bank active.

Although the foregoing description has been made with reference to the preferred embodiments, it is to be understood that changes and modifications of the present invention may be made by the ordinary skilled in the art without departing from the spirit and scope of the present invention and appended claims.

The invention claimed is:

1. A high voltage-generating circuit, comprising:
   a control circuit for generating a refresh signal depending upon a refresh operation command from an external chipset;
   an oscillator driven according to a control signal and for outputting an oscillation signal, in which a cycle of the oscillation signal is controlled by the refresh signal;
   a charge pump circuit for generating a high voltage using a power source voltage according to the oscillation signal, wherein the charge pump circuit has the ascent rate of the high voltage controlled according to variation in the cycle of the oscillation signal; and
   a level detection circuit for comparing the high voltage and a reference voltage to determine whether the high voltage reaches a target value, and for outputting the control signal according to a result of the comparison,
   wherein the oscillator comprises:
      a first logic unit for outputting an output signal in response to the control signal and a signal of an output node;
      two or more delay units for delaying the output signal from the logic unit;
      two or more switching units respectively connected between the two or more delay units and the output node and respectively controlled by the refresh signal; and
      a second logic unit for inputting the signal of the output node and for outputting the oscillation signal.

2. The high voltage-generating circuit as claimed in claim 1, wherein the oscillator reduces the cycle of the oscillation signal according to the level of the refresh signal depending upon the refresh operation command.

3. The high voltage-generating circuit as claimed in claim 1, wherein the first logic unit comprises:
   a NAND gate for inverting the signal of the output node according to the control signal;
   a first inverter for inverting an output signal of the NAND gate; and
   a second inverter for inverting an output signal of the first inverter.

4. The high voltage-generating circuit as claimed in claim 3, wherein the two or more delay units comprise:
   first delay units for delaying an output signal of the second inverter; and
   second delay units for delaying an output signal of the first delay units.

5. The high voltage-generating circuit as claimed in claim 4, wherein the two or more switching units comprise:
   a first transfer gate for transferring the output signal of the first delay units according to the refresh signal; and
   a second transfer gate for transferring an output signal of the second delay units through the operation in a complementary manner together with the first transfer gate according to the refresh signal.

6. The high voltage-generating circuit as claimed in claim 1, wherein charge pump circuit comprises:

a first NMOS transistor having a gate terminal connected to a power supply terminal wherein the first NMOS transistor is connected between the power supply terminal and a first node;

a second NMOS transistor having a gate terminal connected to the power supply terminal wherein the second NMOS transistor is connected between the power supply terminal and a second node;

a third NMOS transistor, which is driven according to an electric potential of the first node, wherein the third NMOS transistor is connected between the first node and the second node;

a first capacitor connected between the first node and an input terminal of the oscillation signal; and a second capacitor connected between the second node and a ground terminal, wherein an electric potential of the second node is used as an electric potential of the high voltage.

7. A high voltage-generating circuit, comprising:

a refresh signal;

a control circuit for generating the refresh signal depending upon a refresh operation;

an oscillator driven according to a control signal and for outputting an oscillation signal, in which a cycle of the oscillation signal is controlled according to the refresh signal;

a charge pump circuit for generating a high voltage using a power source voltage according to the oscillation signal, wherein the charge pump circuit has the ascent rate of the high voltage controlled according to variation in the cycle of the oscillation signal; and a level detection circuit for comparing the high voltage and a reference voltage to determine whether the high voltage reaches a target value, and outputting the control signal having a different level according to a result of the comparison, wherein the oscillator comprises:
   a first logic unit for outputting an output signal in response to the control signal and a signal of an output node;
   two or more delay units for delaying the output signal from the logic unit;
   two or more switching units respectively connected between the two or more delay units and the output node and respectively controlled by the refresh signal; and
   a second logic unit for inputting the signal of the output node and for outputting the oscillation signal.

8. The high voltage-generating circuit as claimed in claim 7, wherein the first logic unit comprises:

a NAND gate for inverting the signal of the output node according to the control signal;

a first inverter for inverting an output signal of the NAND gate; and a second inverter for inverting an output signal of the first inverter.

9. The high voltage-generating circuit as claimed in claim 8, wherein the two or more delay units comprise:

first delay units for delaying an output signal of the second inverter; and second delay units for delaying an output signal of the first delay units.

10. The high voltage-generating circuit as claimed in claim 9, wherein the two or more switching units comprise:

a first transfer gate for transferring the output signal of the first delay units according to the refresh signal; and a second transfer gate for transferring an output signal, which is delayed through the first and second delay means of the second delay units through the operation in a complementary manner together with the first transfer gate according to the refresh signal.

11. The high voltage-generating circuit as claimed in claim 7, wherein the oscillator reduces the cycle of the oscillation signal according to the level of the refresh signal depending upon the refresh operation command.

12. The high voltage-generating circuit as claimed in claim 7, wherein charge pump circuit comprises:

a first NMOS transistor having a gate terminal connected to a power supply terminal wherein the first NMOS transistor is connected between the power supply terminal and a first node;

a second NMOS transistor having a gate terminal connected to the power supply terminal wherein the second NMOS transistor is connected between the power supply terminal and a second node;

a third NMOS transistor, which is driven according to an electric potential of the first node, wherein the third NMOS transistor is connected between the first node and the second node;

a first capacitor connected between the first node and an input terminal of the oscillation signal; and a second capacitor connected between the second node and a ground terminal, wherein an electric potential of the second node is used as an electric potential of the high voltage.

13. A high voltage-generating circuit, comprising:

a control circuit for generating a refresh signal depending upon a refresh operation command from an external chipset;

an oscillator driven according to a control signal and for outputting an oscillation signal, in which a cycle of the oscillation signal is controlled by the refresh signal;

a charge pump circuit for generating a high voltage using a power source voltage according to the oscillation signal, wherein the charge pump circuit has the ascent rate of the high voltage controlled according to variation in the cycle of the oscillation signal; and a level detection circuit for comparing the high voltage and a reference voltage to determine whether the high voltage reaches a target value, and for outputting the control signal according to a result of the comparison, wherein the oscillator comprises a first logic unit enabled by the control signal and receives a signal of an output node;

a first delay unit for delaying an output signal of the logic unit;

a second delay unit for delaying an output signal of the first delay unit;

a first switching unit for transferring the output signal of the first delay unit in response to the refresh signal to the output node;

a second switching unit for transferring an output signal of the second delay unit to the output node in response to a refresh bar signal; and a second logic unit for inputting the signal of the output node and for outputting the oscillation signal.

14. The high voltage-generating circuit as claimed in claim 13, wherein the first logic unit comprises:

a NAND gate for inverting the signal of the output node according to the control signal;

a first inverter for inverting an output signal of the NAND gate; and a second inverter for inverting an output signal of the first inverter.

15. The high voltage-generating circuit as claimed in claim 13, wherein charge pump circuit comprises:
- a first NMOS transistor having a gate terminal connected to a power supply terminal wherein the first NMOS transistor is connected between the power supply terminal and a first node;
- a second NMOS transistor having a gate terminal connected to the power supply terminal wherein the second NMOS transistor is connected between the power supply terminal and a second node;
- a third NMOS transistor, which is driven according to an electric potential of the first node, wherein the third NMOS transistor is connected between the first node and the second node;
- a first capacitor connected between the first node and an input terminal of the oscillation signal; and
- a second capacitor connected between the second node and a ground terminal, wherein an electric potential of the second node is used as an electric potential of the high voltage.

* * * * *